(12) United States Patent
Lin et al.

(10) Patent No.: US 9,368,427 B2
(45) Date of Patent: Jun. 14, 2016

(54) INTEGRATED CIRCUIT FILM AND METHOD OF MANUFACTURING THE SAME

(71) Applicant: Mxtran Inc., Hsin Chu (TW)

(72) Inventors: Chin-Sheng Lin, Zhubei (TW); Cheng-Chia Kuo, Hsinchu (TW); Chih-Cheng Lin, Hsinchu (TW)

(73) Assignee: MXTRAN INC., Hsin Chu (TW)

( * ) Notice: Subject to any disclaimer, the term of this patent is extended or adjusted under 35 U.S.C. 154(b) by 0 days.

(21) Appl. No.: 13/961,927

(22) Filed: Aug. 8, 2013

(65) Prior Publication Data
US 2014/0217614 A1 Aug. 7, 2014

Related U.S. Application Data

(60) Provisional application No. 61/759,473, filed on Feb. 1, 2013.

(51) Int. Cl.
*G06K 21/06* (2006.01)
*H01L 23/48* (2006.01)
(Continued)

(52) U.S. Cl.
CPC ............ *H01L 23/48* (2013.01); *G06K 7/10237* (2013.01); *G06K 7/10297* (2013.01); *G06K 19/0727* (2013.01); *H01L 23/49855* (2013.01); *H01L 21/563* (2013.01); *H01L 23/3121* (2013.01); *H01L 23/4985* (2013.01); *H01L 23/49811* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 2224/0401* (2013.01); *H01L 2224/05568* (2013.01); *H01L 2224/1134* (2013.01); *H01L 2224/131* (2013.01); *H01L 2224/13023* (2013.01);
(Continued)

(58) Field of Classification Search
USPC .......... 257/E23.064, 668, 679, 692, 698, 739, 257/774, 778; 438/118, 119; 455/558
See application file for complete search history.

(56) References Cited

U.S. PATENT DOCUMENTS 5,531,145 A * 7/1996 Haghiri-Tehrani ............... 83/27
6,326,683 B1 * 12/2001 Houdeau et al. ............. 257/679
(Continued)

FOREIGN PATENT DOCUMENTS

CN 1020636935 B 1/2013
EP 2280489 A1 2/2011
(Continued)

OTHER PUBLICATIONS

TW Office Action dated Jan. 28, 2015 in corresponding Taiwan application (No. 102128786).
(Continued)

*Primary Examiner* — Telly Green
(74) *Attorney, Agent, or Firm* — McClure, Qualey & Rodack, LLP

(57) ABSTRACT

An integrated circuit film and a method of manufacturing the same are disclosed. The integrated circuit film includes a circuit board containing a circuit route; a first set of pads located on a first surface of the circuit board and configured to be applicable to ISO 7816 standard; and a semiconductor device mounted on the circuit board for communicating with at least one of the first set of pads. The first set of pads are arranged in two rows and the semiconductor device is mounted on the circuit board in a space between the two rows of pads.

7 Claims, 11 Drawing Sheets

(51) Int. Cl.
*G06K 7/10* (2006.01)
*G06K 19/07* (2006.01)
*H01L 23/31* (2006.01)
*H01L 23/498* (2006.01)
*H01L 21/56* (2006.01)
*H01L 23/00* (2006.01)

(52) U.S. Cl.
CPC ........... *H01L 2224/13144* (2013.01); *H01L 2224/16238* (2013.01); *H01L 2224/293* (2013.01); *H01L 2224/2929* (2013.01); *H01L 2224/32225* (2013.01); *H01L 2224/73204* (2013.01); *H01L 2224/81191* (2013.01); *H01L 2224/83192* (2013.01); *H01L 2224/83851* (2013.01); *H01L 2924/07811* (2013.01)

(56) References Cited

U.S. PATENT DOCUMENTS

| | | | |
|---|---|---|---|
| 6,675,470 | B2 | 1/2004 | Muramatsu |
| 8,577,290 | B2 | 11/2013 | White |
| 8,687,379 | B2* | 4/2014 | Hsiao et al. .................. 361/784 |
| 2004/0087339 | A1 | 5/2004 | Goldthwaite et al. |
| 2008/0099559 | A1* | 5/2008 | Lo et al. ........................ 235/441 |
| 2008/0320187 | A1 | 12/2008 | Kim |
| 2009/0134212 | A1 | 5/2009 | Chamley |
| 2010/0267419 | A1 | 10/2010 | Nishizawa |
| 2010/0309642 | A1* | 12/2010 | Hsiao et al. .................. 361/784 |
| 2011/0149533 | A1 | 6/2011 | Luo et al. |
| 2012/0292395 | A1* | 11/2012 | Huang et al. .................. 235/492 |
| 2013/0064271 | A1 | 3/2013 | van de Beek et al. |
| 2013/0127600 | A1* | 5/2013 | Li et al. ........................ 340/10.5 |
| 2013/0170168 | A1* | 7/2013 | Hsiao et al. .................. 361/784 |
| 2013/0269994 | A1* | 10/2013 | Tang ............................ 174/262 |

FOREIGN PATENT DOCUMENTS

| | | |
|---|---|---|
| EP | 2472730 A1 | 7/2012 |
| FR | 2968430 A1 | 6/2012 |
| TW | M416148 | 11/2011 |
| TW | M427626 | 4/2012 |

OTHER PUBLICATIONS

TW Office Action dated Mar. 31, 2015 in corresponding Taiwan application (No. 102128787).

Non-Final Office Action issued in U.S. App. No. 13/961,924, filed Aug. 8, 2013, mailed May 6, 2015.

EP Search Report dated Nov. 4, 2015 in corresponding EP application (No. 13184766.7-1806/2763079).

* cited by examiner

INTEGRATED CIRCUIT FILM AND METHOD OF MANUFACTURING THE SAME

This application claims the benefit of U.S. provisional application Ser. No. 61/759,473, filed Feb. 1, 2013, the subject matter of which is incorporated herein by reference.

BACKGROUND OF THE INVENTION

1. Field of the Invention

The invention relates in general to an integrated circuit film and a method of manufacturing the same, and more particularly to an integrated circuit film for being attached on a smart card and a method of manufacturing the same.

2. Description of the Related Art

Mobile communication devices are widely used by people in daily life. Utilizing the mobile communication devices as tools for performing business payment is a trend in the future. There are two main ways to achieve the business payment function by the mobile phone. One is by downloading related software from the internet software bank of mobile phones, and the other is by applying a SIM (subscriber identity module) card having a corresponding function. Both of these two ways are inconvenient to the users.

SUMMARY OF THE INVENTION

The invention is directed to an integrated circuit film and a method of manufacturing the same. The thickness of the integrated circuit film according to one embodiment of the present invention is no more than 300 μm and can be attached on a smart card. The integrated circuit film has a semiconductor device and a circuit board; the circuit board can be electrically connected with the semiconductor device and the smart card.

According to a first aspect of the present invention, an integrated circuit film is provided. The integrated circuit film includes a circuit board containing a circuit route; a first set of pads located on a first surface of the circuit board and configured to be applicable to ISO 7816 standard; and a semiconductor device mounted on the circuit board for communicating with at least one of the first set of pads. The first set of pads are arranged in two rows and the semiconductor device is mounted on the circuit board in a space between the two rows of pads.

According to a second aspect of the present invention, a method of manufacturing an integrated circuit film is provided. The method includes the following steps: providing a circuit board containing a circuit route; forming a first set of pads located on a first surface of the circuit board and configured to be applicable to ISO 7816 standard, and mounting a semiconductor device on the circuit board for communicating with at least one of the first set of pads. the first set of pads are arranged in two rows and the semiconductor device is mounted on the circuit board in a space between the two rows of pads.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
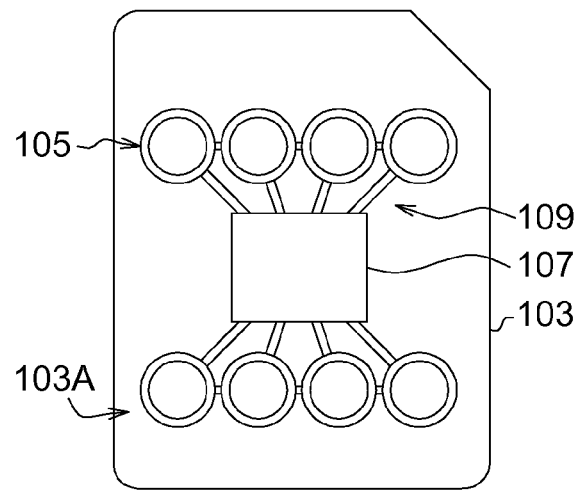
FIG. 1A illustrates an integrated circuit film by showing a first surface according to an embodiment of the invention.

FIG. 1A illustrates an integrated circuit film 101 by showing a first surface 103A according to an embodiment of the invention. The integrated circuit film 101 includes a circuit board 103, for example, a flexible circuit board, a first set of pads 105, and a semiconductor device 107. The circuit board 103 contains a circuit route 109. The first set of pads 105 are located on the first surface 103A of the circuit board 103 and configured to be applicable to ISO 7816 standard. The semiconductor device 107 is mounted on the circuit board 103 for communicating with at least one of the first set of pads 105. The first set of pads 105 are arranged in two rows and the semiconductor device 107 is mounted on the circuit board 103 in a space between the two rows of pads 105.

ISO 7816 standard is an international standard related to electronic identification cards with contacts, especially smart cards, managed jointly by the International Organization for Standardization (ISO) and the International Electrotechnical Commission (IEC). The integrated circuit film 101 having the semiconductor device 107 described above can improve the function of the smart card when the integrated circuit film 101 and the smart card are used together in an electrical device. The electrical device is, for example, a communication device, and the smart card is a subscriber-identity-module (SIM) card.

Figure 1B:
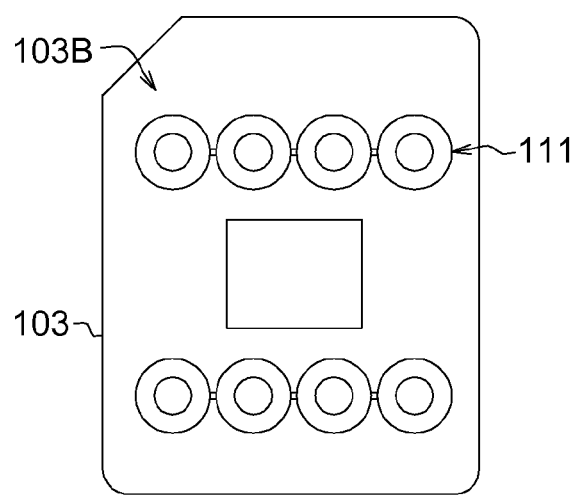
FIG. 1B illustrates the integrated circuit film by showing a second surface thereof.

FIG. 1B illustrates the integrated circuit film 101 by showing a second surface 103B thereof. The integrated circuit film 101 further includes a second set of pads 111 located on the second surface 103B of the circuit board 103 and having at least one pad connected with anyone of the semiconductor device 107 and the first set of pads 105. Which of the semiconductor device 107 and the first set of pads 105 is connected to the at least one pad of the second set of pads 111 is determined by the function or the application of the integrated circuit film 101.

Although the semiconductor device 107 is shown to be mounted in the first surface 103A of the circuit board in FIG. 1A, the semiconductor device 107 can also be mounted in the second surface 103B alternatively based on the function or the application of the integrated circuit film 101. The first set of pads 105, for example, is used for contacting with the communication device while the second set of pads 111 is used for contacting with the SIM card.

Furthermore, the semiconductor device 107 can communicate with anyone of the communication device and the SIM card under a single wire protocol (SWP) communication protocol. The semiconductor device 107 can be connected with at least one of the first set of pads 105 and at least one of the second set of pads 111, and the semiconductor device 107 can include a controller for near field communication (NFC) function. The at least one of the first set of pads 105 described above is, for example, a pad named C6 under the ISO 7816 standard. The pad C6 of the first set of pads 105 is used for communicating under SWP communication protocol.

Figure 2A:
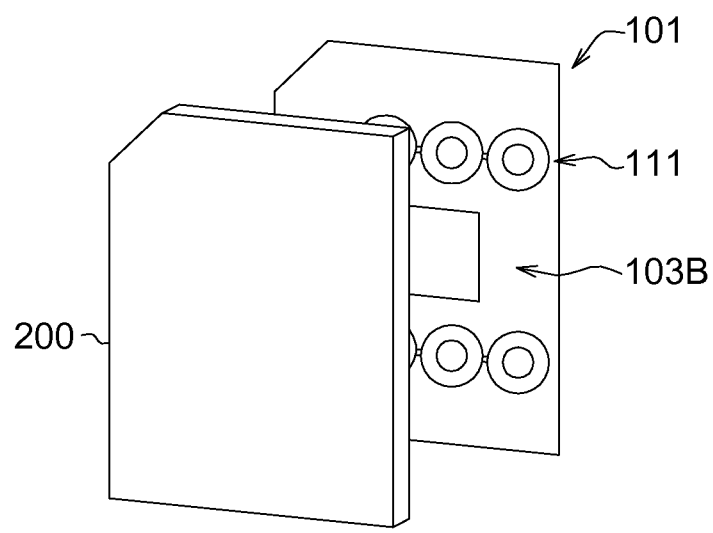
FIGS. 2A~2B show the integrated circuit film and the SIM card from two different sides, respectively.
Figure 2B:
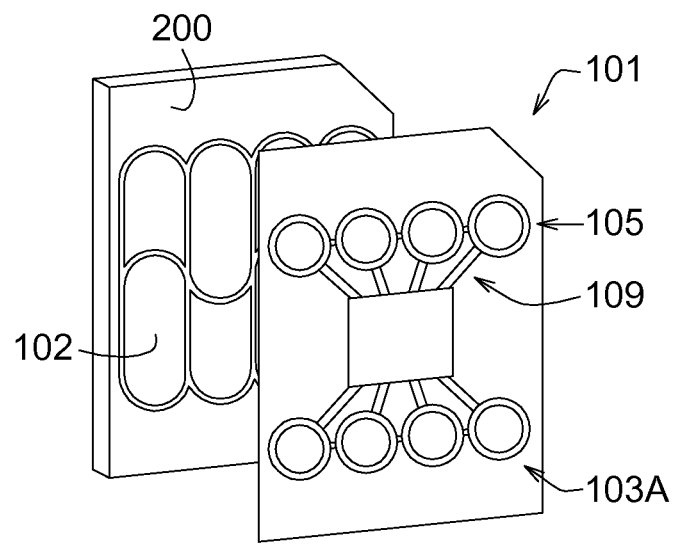

FIGS. 2A~2B show the integrated circuit film 101 and the SIM card 200 from two different sides, respectively. The SIM card 200 is, for example, normal SIM card 200 (normal size). The integrated circuit film 101 for a normal SIM card 200 has a length of about 24.5 mm and a width of about 14.5 mm. Accordingly, the integrated circuit film 101 can have a length no more than 24.5 mm, a width no more than 14.5 mm and a thickness no more than 0.3 mm.

Referring to FIGS. 2A and 2B, when the integrated circuit film 101 is attached to the normal SIM card 200, the second set of pads 111 disposed on the second surface 103B are for being electrically connected with the signal pads 102 of the normal SIM card 200. The first surface 103A of the integrated circuit film 101 is used for being electrically connected with the communication device (not shown in FIG. 2A).

Referring to FIGS. 1A and 1B, a method of manufacturing the integrated circuit film 101 includes the following steps. First, the circuit board 103 containing the circuit route 109 is provided. After that, the first set of pads 105 located on the first surface 103A of the circuit board 103 and configured to be applicable to ISO 7816 standard is formed. Then, the semiconductor device 107 is mounted on the circuit board 103 for communicating with the at least one of the first set of pads 105. The first set of pads 105 are arranged in two rows and the semiconductor device 107 is mounted on the circuit board 103 in a space between the two rows of pads 105.

Figure 3A:
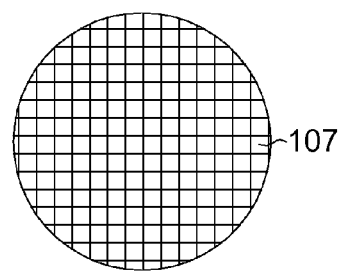
FIGS. 3A~3D show a method for mounting the semiconductor device 107 on the circuit board 103 by means of a COF package technology.
Figure 3B:
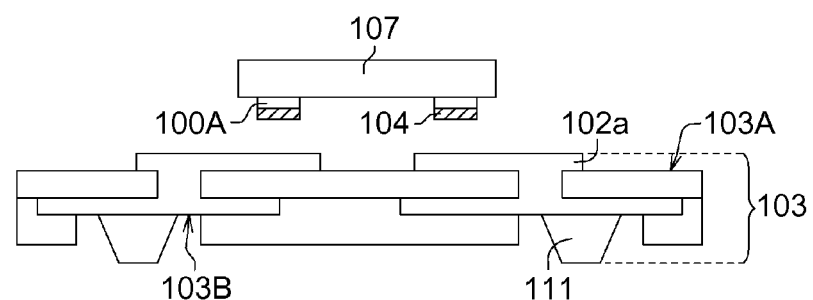

The semiconductor device 107 can be mounted on the circuit board 103 by means of a COF (Chip-On-Film) package technology. A method for mounting the semiconductor device 107 on the circuit board 103 by means of a COF package technology is shown in FIGS. 3A~3D. First, a wafer 10 is prepared, as shown in FIG. 3A. The wafer 10 can be divided into a number of semiconductor devices 107. The semiconductor device 107 includes at least one pad 100A, as shown in FIG. 3B. Then, at least one bump 104 is grown on the at least one pads 100A of the semiconductor device 107. The at least one bump 104, for example, is gold bumps. The thickness of the semiconductor devices 107 is no more than 100 μm. After that, the semiconductor device 107 with the at least one bump 104 is prepared to be integrated with the circuit board 103.

The integrated circuit film 101 comprises at least one pad 102a for being connected with the semiconductor device 107 (the first set of pads 105 are not shown in FIGS. 3B~3D, and FIGS. 4A~4B). The at least one pad 102a protrudes from the first surface 103A, while the second set of pads 111 protrudes from the second surface 103B. One of the second set of pads 111 can be used for transmitting SWP signals for near field communication and/or RF contact-less communication.

Figure 3C:
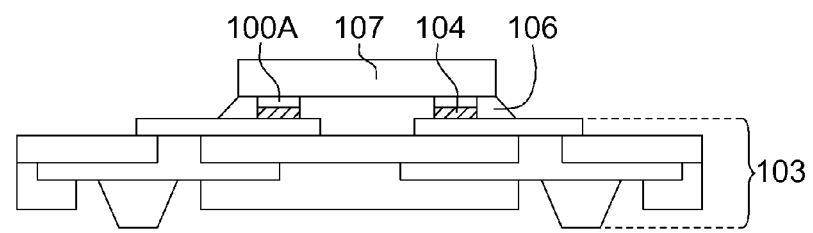

Referring to FIG. 3C, a conductive adhesive 106 is disposed on the first surface 103A, and the at least one bump 104 is connected with the circuit board 103 by means of the conductive adhesive 106. The conductive adhesive 106 can be an anisotropic conductive film, an anisotropic conductive paste, or an anisotropic conductive adhesive.

Figure 3D:
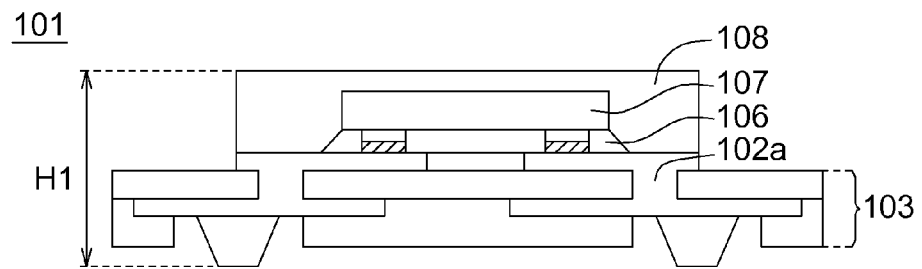

Referring to FIG. 3D, an insulating layer 108 is formed on the semiconductor device 107, and covers the semiconductor device 107, the conductive adhesive 106 and the at least one pad 102a. The insulating layer 108 can comprise an epoxy. Then, the integrated circuit film 101 is formed.

The thickness H1 of the integrated circuit film 101 is no more than about 300 μm. The thickness of the semiconductor device 107 is no more than about 200 μm.

In one embodiment, the insulating layer 108 covers an upper surface and a lateral surface of the semiconductor device 107, and a thickness of the insulating layer 108 on the upper surface of the semiconductor device 107 is no more than 50 μm.

In one embodiment, the first set of pads 105 or the second set of pads 111 comprises a dimple shaped or a bump shaped portion, and the dimple shaped or bump shaped portion protrudes a distance of at least 50 μm from the first surface 103A or the second surface 103B, respectively.

Figure 4A:
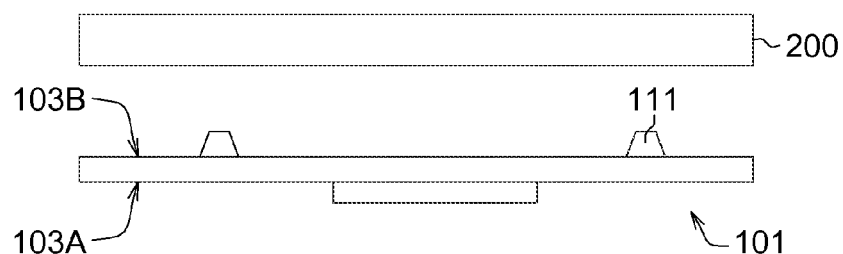
FIGS. 4A~4B show the attachment of integrated circuit film and a normal SIM card.
Figure 4B:
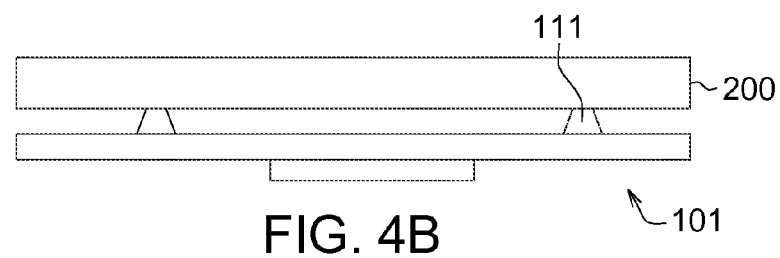

FIGS. 4A~4B show the attachment of integrated circuit film 101 and a normal SIM card 200. When the integrated circuit film 101 is attached to the normal SIM card 200, the second set of pads 111 on the second surface 103B is electrically connected with the normal SIM card 200.

Figure 5:
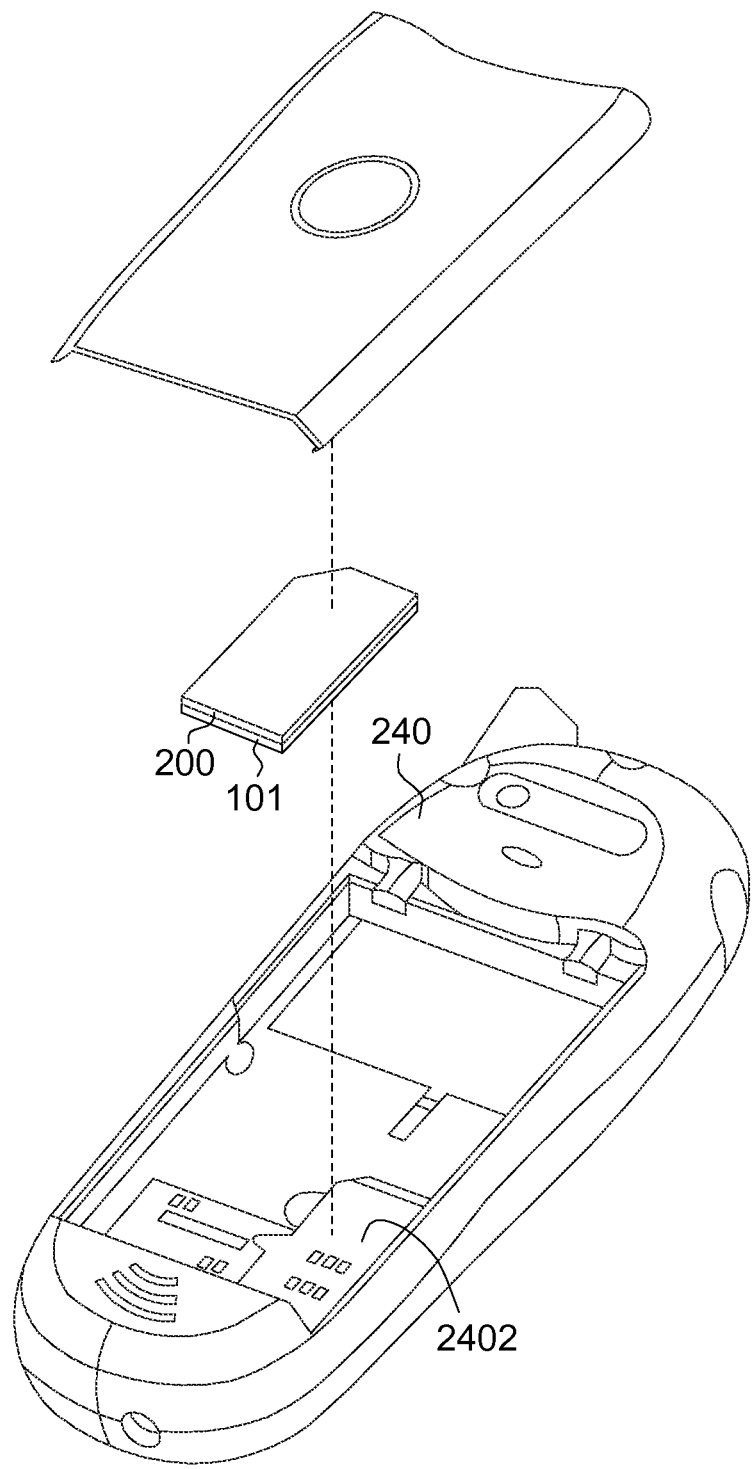
FIG. 5 illustrates disposing the integrated circuit film attached with the normal SIM card in a card slot of a communication device.

FIG. 5 illustrates disposing the integrated circuit film 101 attached with the normal SIM card 200 in a card slot 2402 of a communication device, for example, a mobile phone 240. Since the integrated circuit film 101 has a thickness of no more than 300 μm, the integrated circuit film 101 attached with the normal SIM card 200 can be fitted into the mobile phone 240. Besides, since the integrated circuit film 101 has the insulating layer 108 disposed on the semiconductor device 107 to protect the semiconductor device 107, the lifetime of the semiconductor device 107 can be prolonged.

Figure 6A:
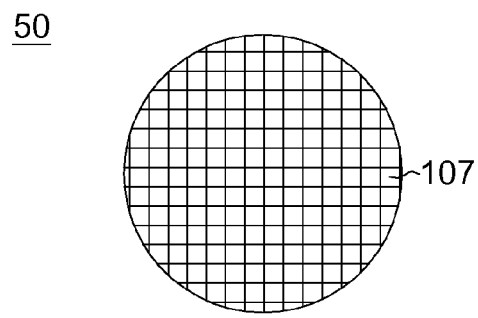
FIGS. 6A~6F show a method for mounting the semiconductor device 107 on the circuit board 103 by means of a WLCSP package technology.
Figure 6B:
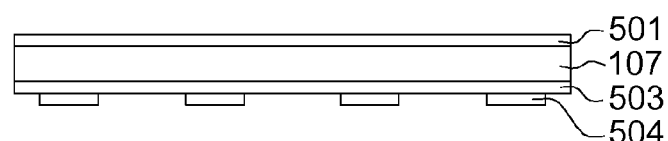

Alternatively, the semiconductor device 107 can also be mounted on the circuit board 103 by means of a WLCSP (Wafer Level Chip Scale Package) package technology according to another embodiment of the invention. A method for mounting the semiconductor device 107 on the circuit board 103 by means of a WLCSP package technology is shown in FIGS. 6A~6F. In FIG. 6A, a wafer 50 is prepared. The wafer 50 can be divided into a number of semiconductor devices 107. As shown in FIG. 6B, the semiconductor device 107 has a redistribution layer (RDL) 503, a number of bumps 504, and an insulating layer 501. The insulating layer 501 covers the upper surface of the semiconductor device 107. The insulating layer 501 can comprise epoxy. The RDL 503 is formed on the lower surface of the semiconductor device 107, and the bumps 504 are formed on the RDL 503. The bumps 504, for example, are solder balls. The thickness of the semiconductor device 107 is no more than 150 μm.

Figure 6C:
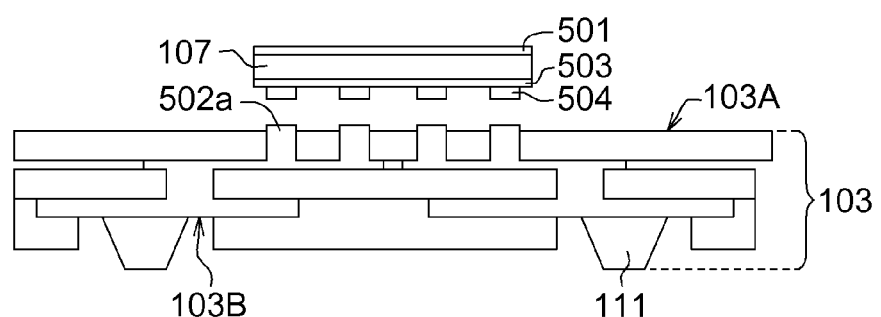

As shown in FIG. 6C, the circuit board 103 includes a number of pad 502a for being connected with the semiconductor device 107 (the first set of pads 105 is not shown in FIGS. 6A~6F). The pads 502a are disposed on the first surface 103A and protrude from the first surface 103A.

Figure 6D:
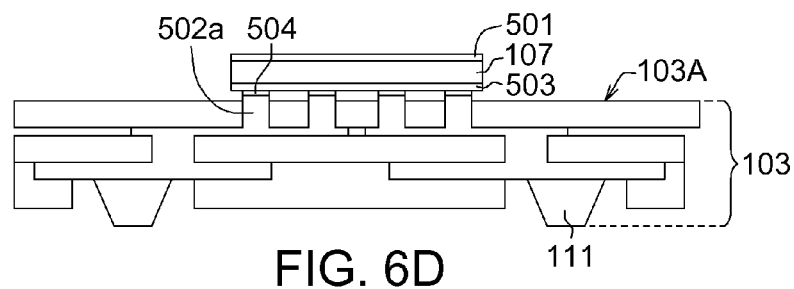

Referring to FIG. 6D, the pads 502a are contacted to the bumps 504 of the semiconductor device 107, and the pads 502a are electrically connected to the bumps 504 on the semiconductor device 107 by surface mount technology (SMT).

Figure 6E:
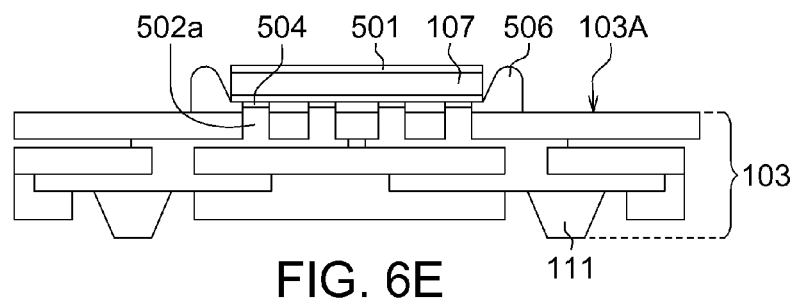

Referring to FIG. 6E, an underfill layer 506 is formed on the first surface 103A of the circuit board 103 to cover the lower surface of the semiconductor device 107. In particular, the underfill layer 506 is formed on the first surface 103A of the circuit board 103 and between the pads 502a and the bumps 504 on the semiconductor device 107. The RDL 503 is interposed between the semiconductor device 107 and the circuit board 103 for connection therewith, and the RDL 503 is packaged with the semiconductor device 107.

Figure 6F:
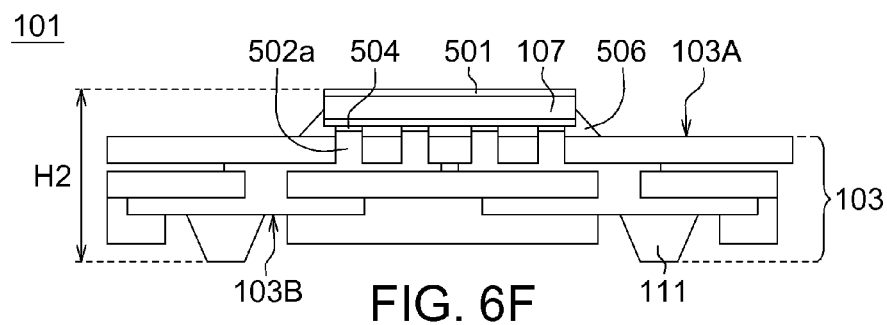

After that, as shown in FIG. 6F, the integrated circuit film 101 is formed and can be attached to a normal SIM card 200. The substantial thickness of the insulating layer 501 on the upper surface of the semiconductor device 107 is at least 15 μm and is no more than 20 μm. The thickness H2 of the integrated circuit film 101 is no more than about 300 μm. The thickness of the semiconductor device 107 is no more than about 200 μm.

The integrated circuit film 101 is not restricted to be attached on a normal SIM card. The size of the integrated circuit film 101 can be designed to match a SIM card, which can be one of SIM, USIM (Universal Subscriber Identity Module), UIM (User Identity Module), RUIM (Removable User Identity Module), Micro-SIM, and Nano-SIM cards. The integrated circuit film 101 can be designed to match a normal size, a Micro size, and a Nano size SIM card to meet different market requirements. The length-width ratio of the integrated circuit film 101 can be designed to correspond to a length-width ratio of the selected SIM card.

Based on the above, the integrated circuit film according to embodiments of the invention has a thickness of no more than 300 μm and can be fitted into most of the SIM card and the communication devices. Besides, since the integrated circuit film has an insulating layer disposed on the semiconductor device to protect the semiconductor device, a lifetime of the semiconductor device can be prolonged.

Figure 7A:
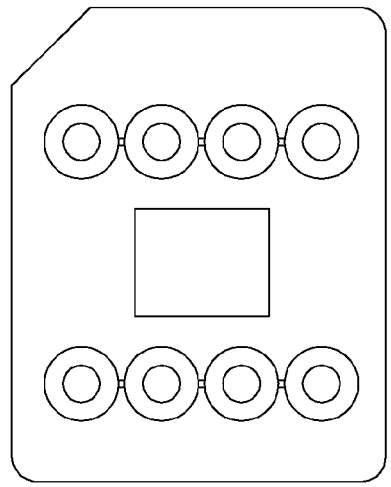
FIG. 7A and FIG. 7B shows one example of an integrated circuit film for Micro-SIM card which has 8 contacts.
Figure 7B:
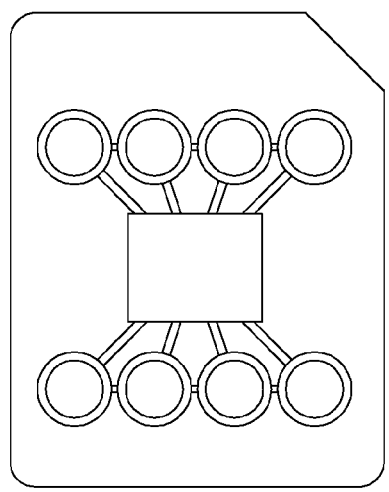

FIG. 7A and FIG. 7B shows one example of an integrated circuit film 701 for Micro-SIM card which has 8 contacts. The integrated circuit film 701 for a Micro-SIM card has a length of about 15 mm and a width of about 11.8 mm.

Figure 8A:
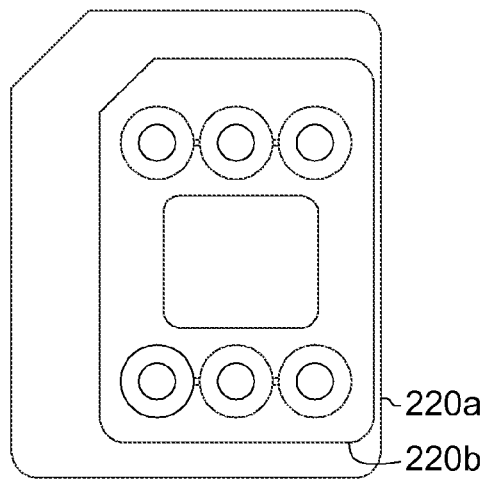
FIG. 8A and FIG. 8B shows one example of a integrated circuit film for Micro/Nano SIM card which has 6 contacts.
Figure 8B:
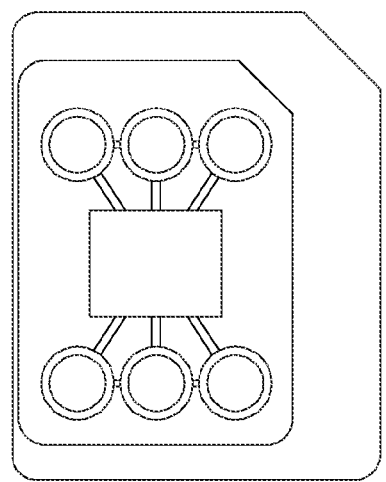
Figure 9A:
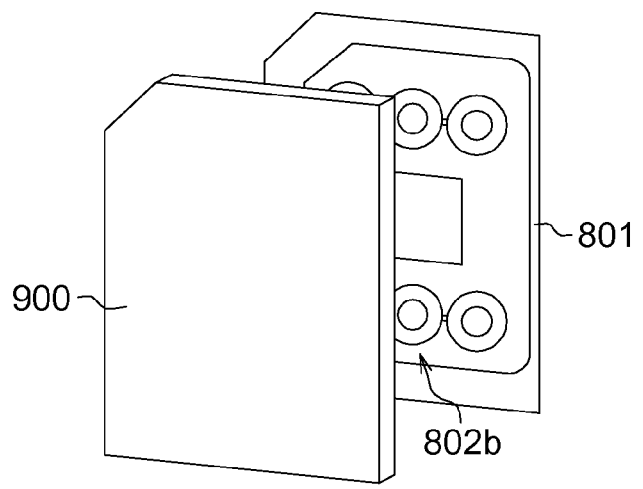
FIGS. 9A~9B show the integrated circuit film and the Micro/Nano SIM card from two different sides, respectively.
Figure 9B:
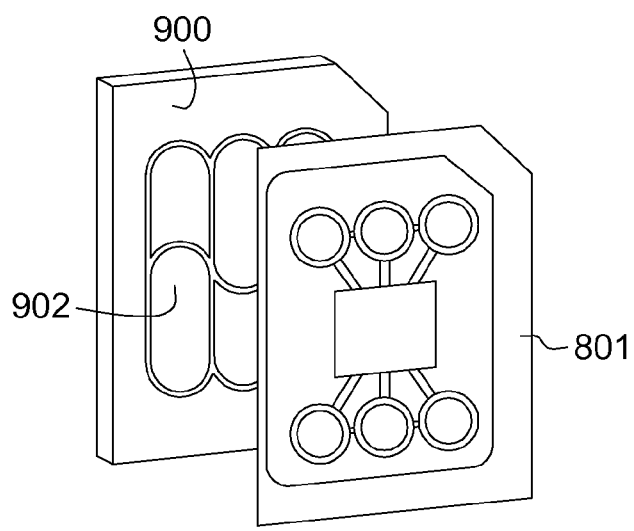

FIG. 8A and FIG. 8B shows one example of a integrated circuit film 801 for Micro/Nano SIM card which has 6 contacts. FIGS. 9A~9B show the integrated circuit film 801 and the Micro/Nano SIM card 900 from two different sides, respectively. Referring to FIG. 8A, the outer outline 220a of the integrated circuit film 801 corresponds to a Micro-SIM card and has a length of about 15 mm and a width of about 11.8 mm. The inner outline 220b of the integrated circuit film 801 corresponds to a Nano-SIM card and has a length of about 12.3 mm and a width of about 8.8 mm. The integrated circuit film 801 and the Micro/Nano SIM card 900 can be electrically connected by the second set of pads 802b on the integrated circuit film 801 and the signal pads 902 on the Micro/Nano SIM card 900.

Figure 10A:
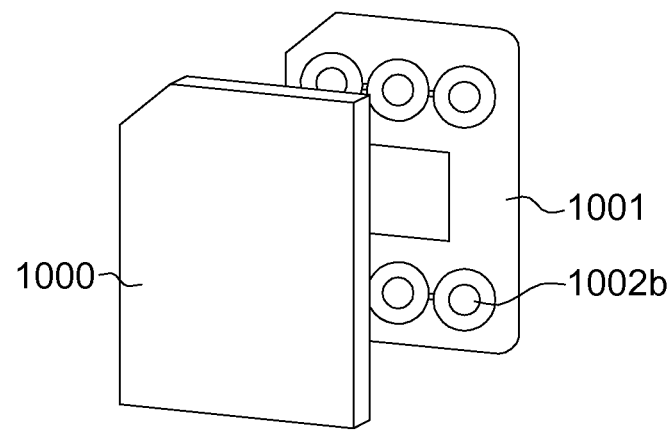
FIGS. 10A~10B show an integrated circuit film and the Nano-SIM card from two different sides, respectively.
Figure 10B:
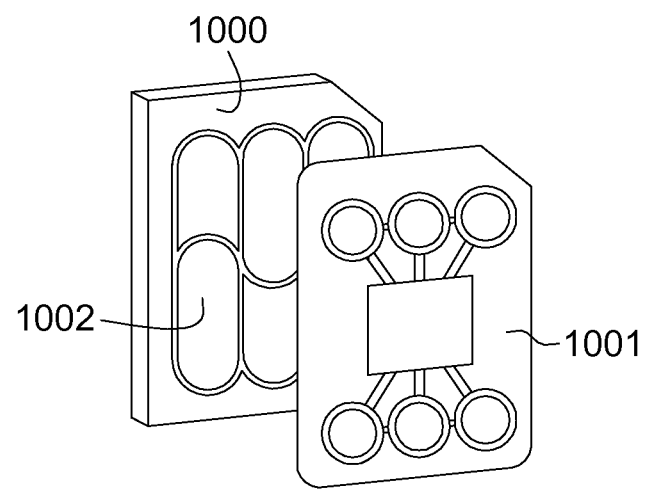

FIGS. 10A~10B show an integrated circuit film 1001 and the Nano-SIM card 1000 from two different sides, respectively. The integrated circuit film 1001 is configured to be used with a Nano-SIM card. The integrated circuit film 1001 and the Nano-SIM card 1000 can be electrically connected by the second set of pads 1002b on the integrated circuit film 1001 and the signal pad 1002 on the Nano-SIM card 1000.

The way of disposing the integrated circuit film 701, the integrated circuit film 801, and the integrated circuit film 1001 attached with a SIM card in a card slot of a communication device is similar to what is shown in FIG. 5. They are not repeated herein. The integrated circuit film 701 (for Micro-SIM card), the integrated circuit film 801 (for Micro/Nano SIM card), and the integrated circuit film 1001 (for Nano-SIM card) can be selected to match a corresponding Micro-SIM card or Nano-SIM card to be attached on.

The integrated circuit film according to the embodiments of the invention can be integrated with the communication device and the SIM card, and can be applied to achieve the business payment function. By disposing the integrated circuit film between the communication device and the SIM card, the communication device can have additional functions, such as an information security function, without modifying any software. Therefore, the integrated circuit film according to the embodiments of the invention can increase the adaptation between the SIM card and the communication devices, without consideration the telecom operators, the type of the communication device, or the type of the SIM card and comply with the market requirement.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An integrated circuit film, comprising:
   a circuit board containing a circuit route;
   a first set of pads located on a first surface of the circuit board and configured to be applicable to ISO 7816 standard, wherein the first set of pads is used for electrically contacting with a communication device;
   a second set of pads located on a second surface of the circuit board and having at least one pad connected with a semiconductor device or the first set of pads, wherein the second set of pads is used for electrically contacting with a subscriber-identity-module (SIM) card so that the integrated circuit film and the SIM card are combined and inserted into a SIM card slot of the communication device together; and
   the semiconductor device mounted on the circuit board for communicating with the communication device through at least one of the first set of pads;
   wherein both the first set of pads and the second set of pads are arranged in two rows and the semiconductor device is mounted on either the first surface or the second surface of the circuit board in a space between the two rows of either the first set of pads or the second set of pads,
   wherein the semiconductor device mounted on the integrated circuit film for communicating with both of the communication device and the SIM card under a single wire protocol (SWP) communication protocol.

2. The film according to claim 1, wherein the semiconductor device comprises at least one pad and is mounted on the circuit board in which at least one bump is grown on the least one pad of the semiconductor device for connecting with the circuit board and connected with the circuit board by means of a conductive adhesive.

3. The film according to claim 1, wherein the semiconductor device is mounted on the circuit board in which a redistribution layer (RDL) is interposed between the semiconductor device and the circuit board for connection therewith, and wherein the RDL is packaged with the semiconductor device and the semiconductor device is connected to the circuit board via solder balls.

4. The film according to claim 1, wherein the at least one of the first set of pads is a pad named C6 under the ISO 7816 standard.

5. The film according to claim 1, wherein the semiconductor device connects with at least one of the first set of pads and at least one of the second set of pads and comprises a controller for near field communication (NFC) function.

6. The film according to claim 1, wherein the thickness of the integrated circuit film is no more than 300 μm.

7. The integrated circuit film according to claim 1, wherein the SIM card is one of SIM (subscriber identity module), USIM (Universal Subscriber Identity Module), UIM (User Identity Module), RUIM (Removable User Identity Module), Micro-SIM and Nano-SIM cards.

* * * * *